US006427015B1

(12) United States Patent
Backram et al.

(10) Patent No.: US 6,427,015 B1
(45) Date of Patent: Jul. 30, 2002

(54) POWER SUPPLY FOR MICROPHONE

(75) Inventors: Lars Backram; Hans-Erik Backram, both of Saffle; Borje Gustafsson, Svanskog, all of (SE)

(73) Assignee: GN Netcom A/S, Ballerup (DK)

( * ) Notice: Subject to any disclaimer, the term of this patent is extended or adjusted under 35 U.S.C. 154(b) by 0 days.

(21) Appl. No.: 09/319,339

(22) PCT Filed: Dec. 11, 1996

(86) PCT No.: PCT/DK96/00521

§ 371 (c)(1), (2), (4) Date: Sep. 10, 1999

(87) PCT Pub. No.: WO98/26631

PCT Pub. Date: Jun. 18, 1998

(51) Int. Cl.[7] .............................................. H03F 21/00
(52) U.S. Cl. ........................................ 381/120; 381/122
(58) Field of Search ........................... 381/91, 120, 111, 381/113, 114, 115, 122

(56) References Cited

U.S. PATENT DOCUMENTS 4,041,247 A 8/1977 Briley
4,541,112 A 9/1985 Kern
5,387,875 A * 2/1995 Tateno ........................ 381/120

FOREIGN PATENT DOCUMENTS

GB 2 293 740 A 4/1996

* cited by examiner

*Primary Examiner*—Minsun Oh Harvey
(74) *Attorney, Agent, or Firm*—Altera Law Group, LLC

(57) ABSTRACT

The invention concerns a circuit for the amplification of signals from a microphone, comprising a power source and a current generator which supplies a microphone, such as an electret microphone, with electrical energy in the form of pulses. The circuit clocks the power supply to the microphone with an active pulse time t1, and the sampling circuit reads the microphone signal in a window with the duration t2 calculated from the rear flank of the active part of the supply pulse, whereby t1 is shorter than the time period T corresponding to the sampling frequency 1/T, and whereby t1 is of a length which is sufficient to enable the microphone current to reach a usable value, and whereby t2 can be shorter than t1.

5 Claims, 3 Drawing Sheets

POWER SUPPLY FOR MICROPHONE

The invention concerns a circuit for the amplification, analog signal processing and A/D conversion of signals from a microphone as defined in the preamble to claim 1.

It is known within microphone and audio technology to integrate D/A conversion and microphone amplification in one unit, so that the sampling point is moved as close as possible to the microphone, and herewith reduce signal distortion, noise and hum which can arise with long signal paths. To reduce noise pulses, it is known from patent application GB-A-2 293 740 to build A/D converters and microphone power supplies on the same circuit board, where the microphone power supply works with pulse modulation at a frequency which is derived from the sampling frequency in the A/D converter. This patent application forms the basis for the two-part form of claim 1.

Where a wide range of portable products within telecommunication, video and audiometrics are concerned, as well as hearing aids and other micro-electronics, the weight and the physical dimensions of the equipment play an important role for the equipment's fields of application and marketability.

The power consumption belongs typically among the important factors which, together with the relevant battery technology, are determinative for precisely the weight and the physical dimensions of the portable equipment. Therefore, in many connections it is decisive that attempts are made to reduce the power consumption as much as possible.

With active microphones, such as electret microphones, these are normally supplied with a constant current which is in the magnitude of 100–600 $\mu$A. For the above-mentioned applications, this constitutes a high current consumption. It is therefore a principle object of the present invention to reduce the current consumption.

This is achieved with the invention as defined in claim 1.

According to the invention as defined in claims 2–4, a strongly reduced current consumption is achieved, in that the microphone coupling is provided with current pulses of such a short duration that the microphone current reaches a usable value. The current consumption in such a coupling is typically only 0.01–0.03 $\mu$A per duty cycle.

According to the invention as defined in claim 5, a particularly advantageous coupling is achieved, in that the coupling together of the microphone and amplifier in one unit makes a high signal/noise ratio possible.

Figure 1:
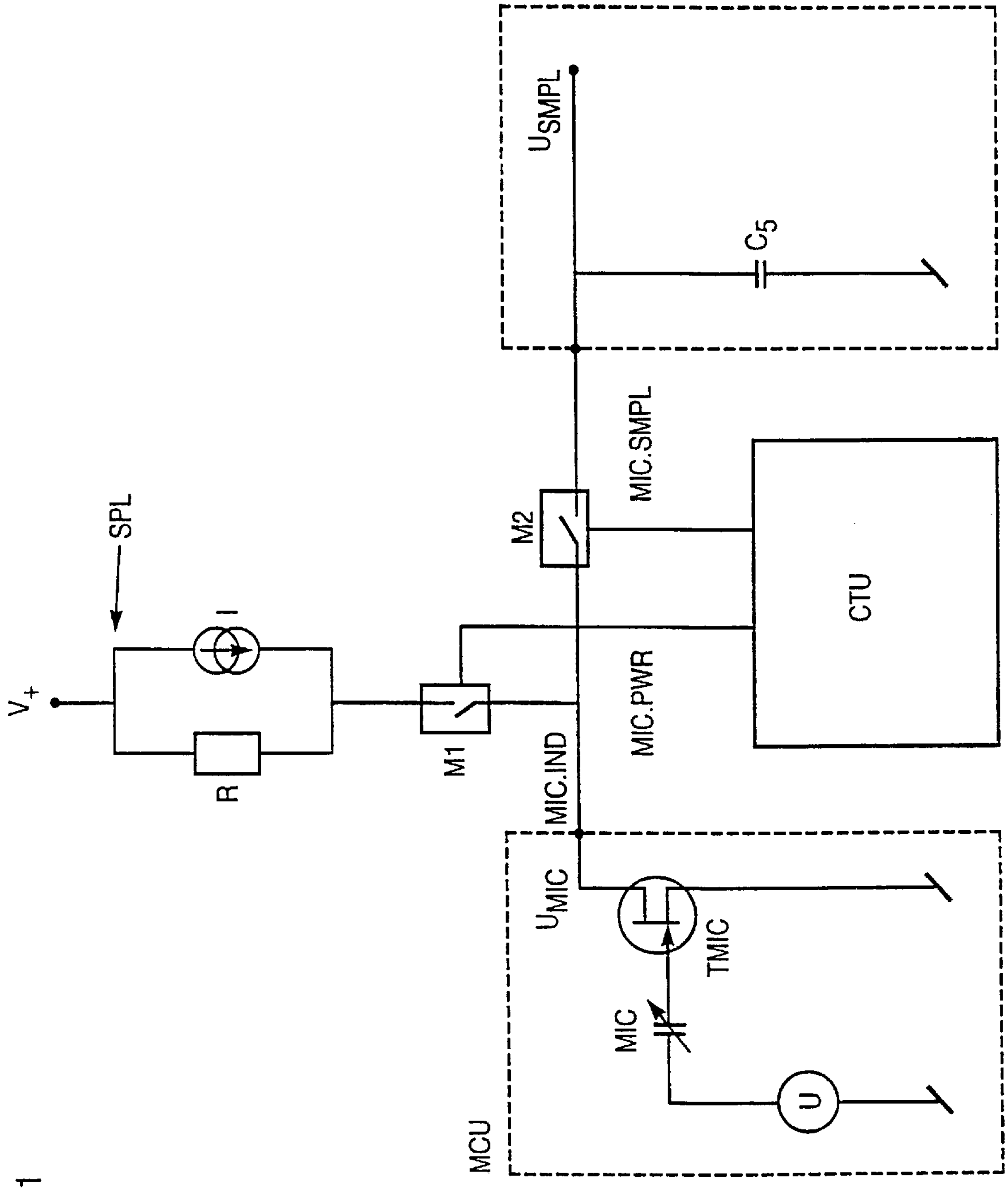
Figure 2:
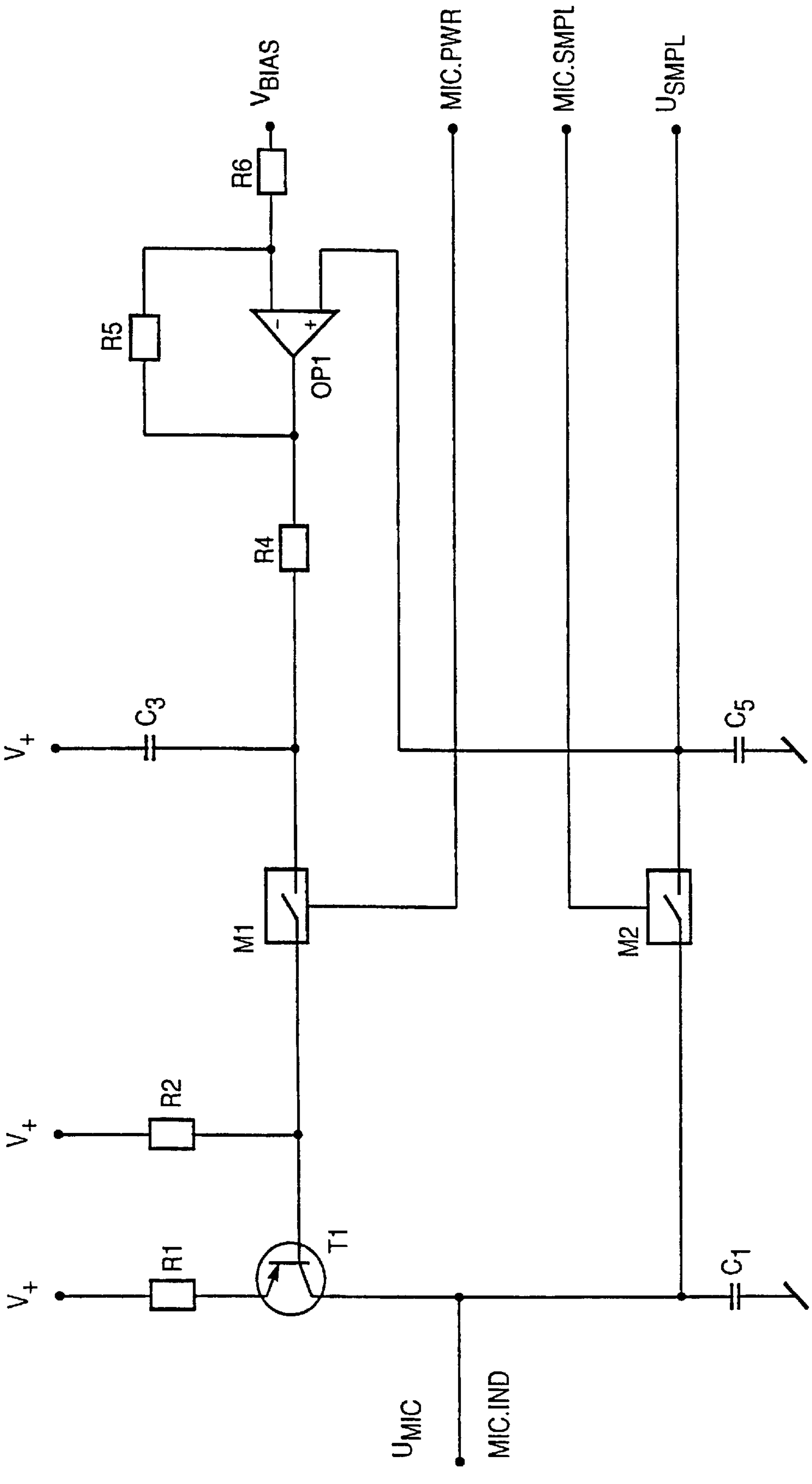
Figure 3:
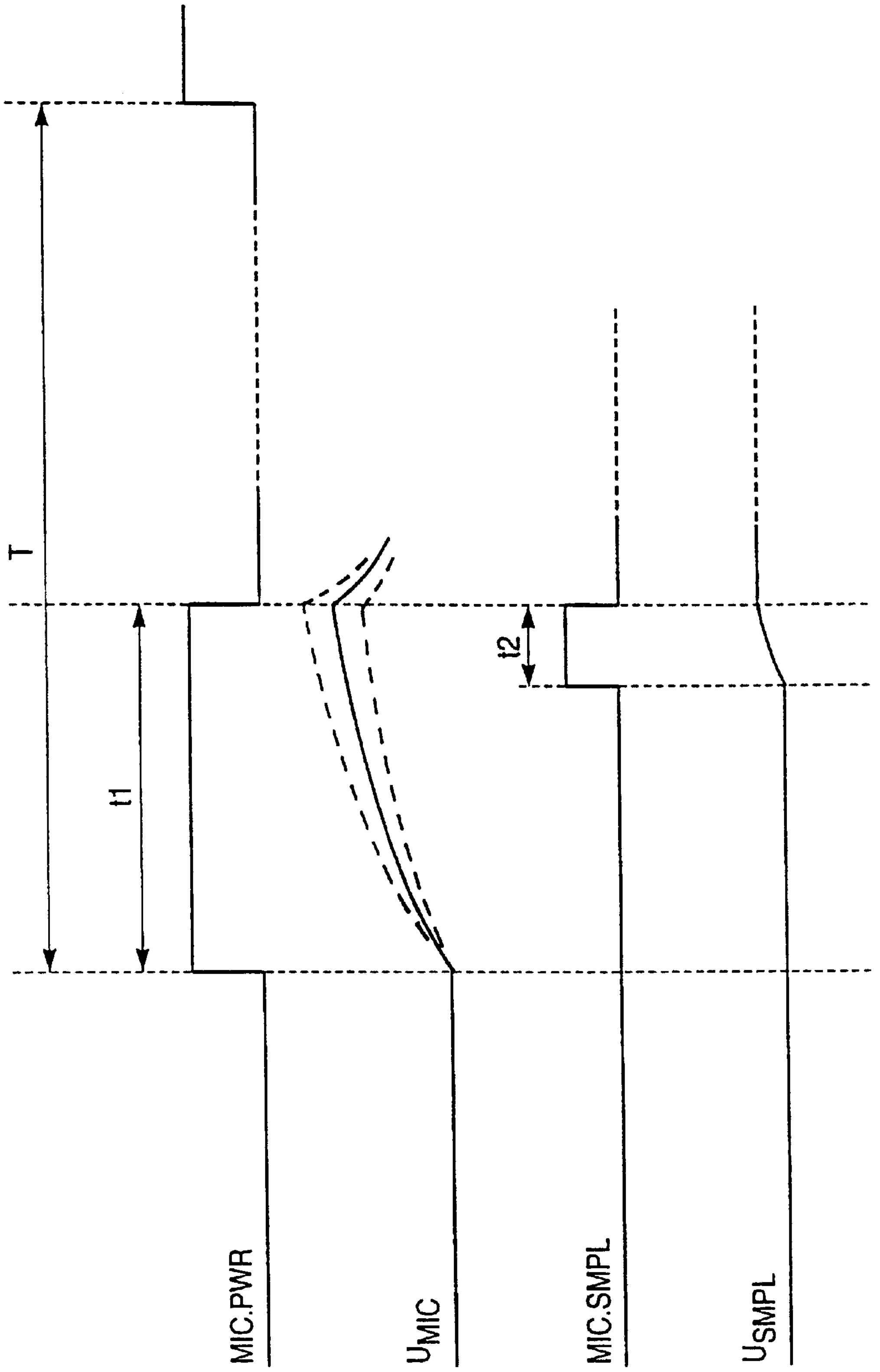

With reference to the figures, the invention will be described in more detail-in the following, in that FIG. 1 shows a principle diagram of the circuit, FIG. 2 shows an example embodiment of the invention, and FIG. 3 shows the signal sequences for the circuit according to the invention.

In the principle diagram, FIG. 1, is shown an electret microphone which, for example, can have an upper limit frequency of around 15 kHz. This upper limit frequency can also lie closer to the maximum limit frequency of the audible range if a microphone of high quality is used. The microphone can be protected by a thin protective net, such as a thin layer of foam material which, however, will reduce the upper limit frequency of the microphone membrane.

The membrane on an electret microphone comprises a variable capacitor which changes depending on the acoustic signal to which the microphone is exposed. In the manufacture of the electret microphone, the membrane is provided with a permanent charge which can remain unchanged for several years. The equivalent diagram for an electret microphone can thus be considered as a battery in series with a variable capacitor.

In the principle diagram, FIG. 1, a microphone unit, MCU, comprises such an electret microphone and a transistor, TMIC, which is placed physically close to the membrane and connected to the membrane's terminals. The transistor TMIC can with advantage be a J-FET transistor because of the ideal infinitely high input impedance of this type of transistor. Small signals from signal sources with high output impedance can hereby be amplified for further signal processing.

For the registration of the membrane movement, according to the invention there is disclosed a voltage generator and possibly a current generator for supplying the transistor TMIC in the microphone and the subsequent signal processing with electrical energy. FIG. 1 shows a voltage generator and a current generator which are equivalent to a non-ideal impedance connected in parallel with a constant current generator. This power supply has the designation SPL.

The object of the above-mentioned generators is to provide the transistor TMIC with a constant operating current which is selected in accordance with the optimum working specifications of the transistor.

A membrane deflection for a given time will give rise to a certain voltage across the microphone membrane's terminals, which will result in a current which is proportional to the membrane deflection through the transistor TMIC.

The constant working current is thus modulated by the acoustically-derived signal, so the current through TMIC varies around the constant working current. It is this constant working current which is desired to be reduced by the invention.

For reasons of cost, the current generator in the above-mentioned coupling can be dispended with. However, this alternative will result in a lower signal/noise ratio, the reason being that the transistor does not work under ideal conditions.

According to the invention, the transistor TMIC is provided with current across an electric switch M1 which is controlled by a digital control circuit CTU via the signal MIC.PWR. This switch, M1, is opened and closed at periodic intervals of T and is active for the time t1.

The voltage $U_{mic}$ from the microphone supplies a sampling capacitor C5 via the electric switch M2, which is active for the time t2 and is controlled by the signal MIC.SMPL from the control unit CTU. This signal is converted to digital values by a subsequent sampling circuit (not shown) which, synchronously with M1 and M2, operates at the sampling frequency 1/T.

The sampling frequency or the Nyquist frequency can be selected in the normal manner to be at least double the desired upper limit frequency of the audio signal. Sampling can also be effected in the conventional manner with over-sampling in order to reduce negative effects of filtration of the higher harmonic contributions from the sampling process.

It is also possible for the sampling process to be effected by a circuit working analogically.

The time sequence of the signals MIC.PWR and MIC-.SMPL is shown in FIG. 3:

The time t1, where M1 conducts current to the transistor TMIC, is considerably shorter than the time period T, and is selected to be of sufficient length for $U_{mic}$ to reach a usable value. The microphone amplifier is thus provided with relatively short pulses seen in comparison with the sampling time T.

Within the time t1, the output signal from the microphone is more or less constant, seen in relation to the variations within the time T, and a certain value higher or lower than at the last sample. This signal change will now give rise to a change in the current through the transistor TMIC.

Since in practice the microphone/transistor coupling MIC/TMIC contains parasite capacitances across the terminals, the current through the transistor can not rise more quickly than that speed at which these capacitances can be charged and discharged. $U_{mic}$ thus follows a charging or discharging sequence which converges asymptotically towards a value which is proportional to the change of the given membrane deflection in relation to the last sample.

A typical sequence of $U_{mic}$ is thus shown in FIG. 3.

The magnitude of the signal $U_{mic}$, indicated by the stippled lines in FIG. 3, thus depends on the amplitude of the audio signal for a given time.

The sampling circuit reads $U_{mic}$ as late as possible within the time t1, the reason being that $U_{mic}$ has the best signal/noise ratio at the end of t1. $U_{smpl}$ is thus active in a window with the duration t2 seen from the rear flank of the active part of the supply pulse t1 controlled by M1. The time t2 is shorter than t1 and, depending on the speed at which C5 is charged, can be selected to be considerably shorter than t1.

$U_{mic}$ can be considered as being more or less constant within the time t2, and the charging of the sampling capacitor C5 in the time t2 can be approximated by an RC circuit in which R can vary from 500 ohms–5 Kohms, since the resistance of the electric switch M2 is insignificant. Typical values for the time constant which applies during t2 will then be 0.05–0.5 μs when C5 is of 100 pF.

The sampling capacitor C5 will thus be charged or discharged at the above-mentioned time constant which applies during t2 from the previous sample value towards a level which asymptotically approaches the voltage across the microphone membrane at a given time. This voltage, $U_{smpl}$, is seen in FIG. 3.

How short t1 can be set in practice will depend on how low a signal/noise ratio can be accepted for $U_{mic}$, which among other things must be selected in accordance with the parasite capacitances arising in the microphone transistor TMIC and with the accuracy of the sampling process and the use in general. It has proved in practice that a commencement of the sampling pulse (M2) already at t1–t2 corresponding to the double time constant (2 RC gives exp(−2RC/RC)=0.86) provides usable values. Typical values of t1 can lie at 0.2–3.0 μs.

If, for example, it is desired to transfer an audio signal of up to 20 kHz, and a sampling frequency of 44 kHz is used (T=23 μs), it is seen that the low values of t1 and t2 stated above will give rise to a considerable saving in current.

Speech signals can be transferred with acceptable results at a sampling frequency of e.g. 10 kHz (T=100 μs), and in this case it is evident that the saving in current is even greater for the pulsed microphone circuit.

In FIG. 2 is seen an example embodiment where the current generator in FIG. 1 is configured with an operational amplifier OP1 which feeds the signal $U_{smpl}$ back through an electric switch M1 to the base of a transistor T1, which in turn supplies a microphone unit MCU (not shown in FIG. 2), which couples current to the terminal MIC.IND.

The operational amplifier is connected to the resistors R4, R5 and R6 and the capacitor C3, which removes possible noise from OP1.

The transistor T1 is biased by the resistor network R1 and R2.

The output from the microphone unit can be damped via a capacitor as shown by C1 in order to avoid possible frequency contributions over the half sampling frequency being conducted further to the sampling circuit.

The signal from the microphone $U_{mic}$ is fed across the electric switch M2, which in practice is connected to small parasite capacitances, forward to the sampling capacitor C5, across which there is coupled a subsequent A/D converter circuit with possible limiter circuit. M1 and M2 are controlled via the signals $Mic_{pwr}$ and $Mic_{smpl}$ by a control circuit CTU to operate as described above and synchronously with the sampling circuit SMPL.

The object of the coupling in FIG. 2 is to adjust or to adapt the current through the microphone, so that a suitable average value for the voltage across C5 is obtained. The voltage across C5 is controlled in accordance with the adjustable level $V_{bias}$, so that TMIC in the microphone works at an optimized operation point.

The present invention is naturally not limited only to electret microphones as described in the example embodiment. The invention can be used with advantage for other types of active microphones, such as capacitor microphones with external power source and piezo-sensitive semiconductor microphones. Similarly, other types of semiconductor components can be used instead of J-FET transistors.

A limiter circuit can be inserted in the signal path before the sampling circuit. According to the invention, these circuit elements can similarly operate in a sampled manner and hereby further reduce the current consumption.

Component list for the circuit in FIG. 2:

| | |
|---|---|
| R1 | 470 ohms |
| R2 | 330 ohms |
| R4 | 15 Kohms |
| R5 | 1 Megohm |
| R6 | 47 Kohms |
| C1 | 10 pF |
| C3 | 10 μF |
| C5 | 100 pF |
| T1 | BSR 20 A - BF 411 |
| M1 | IC 101 A - HC 4066 |
| M2 | IC 101 B - HC 4066 |
| Op1 | IC 102 B - HC 4066 |

What is claimed is:

1. A circuit for the amplification of signals from a microphone unit (MCU), comprising a power supply (SPL) which provides the microphone unit (MCU) with electrical energy in the form of pulses, a sampling circuit for conversion of the microphone signal, in which sampling is effected at a sampling frequency of 1/T, characterized in that the power supply (SPL) transfers energy to the microphone unit (MCU) in the form of pulses with an active pulse time t1, and in that the sampling circuit reads the microphone signal in a window with duration t2 calculated from the rear flank of the active part of the supply pulse, where t1 is smaller than the time period T corresponding to the sampling frequency 1/T, and where t2 is smaller than t1.

2. A circuit for the amplification of signals from a microphone unit in accordance with claim 1, characterized in that t1 is at least 10 times smaller than the time period T.

3. A circuit for the amplification of signals from a microphone according to claim 1, characterized in that t2 is at least 10 times smaller than t1.

4. A circuit in accordance with claim 1, characterized in that t1 is about 0.2 to 3.0 μs, t2 is about 0.05 to 0.5 μs.

5. A circuit for the amplification of signals from a microphone according to claim 1, characterized in that the microphone unit (MCU) comprises a microphone (MIC) and a transistor (TMIC), the one terminal of which is connected directly to and placed close to the microphone (MIC), whereby the transistor (TMIC) is supplied with current through a first switch (M1) which connects the current from the power supply (SPL) for the time t1, and whereby an output signal which is amplified in the transistor (TMIC) is transferred to the subsequent sampling circuit by a second switch (M2) which is closed for the time t2, and whereby the switches (M1, M2) are controlled by a control unit (CTU).

* * * * *